(12) United States Patent
Kurihara et al.

(10) Patent No.: US 10,388,844 B2
(45) Date of Patent: Aug. 20, 2019

(54) SENSOR MODULE AND MANHOLE INFORMATION COLLECTION/PROCESSING SYSTEM

(71) Applicant: FUJITSU LIMITED, Kawasaki-shi (JP)

(72) Inventors: Kazuaki Kurihara, Atsugi (JP); Norinao Kouma, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 78 days.

(21) Appl. No.: 15/429,424

(22) Filed: Feb. 10, 2017

(65) Prior Publication Data
US 2017/0222115 A1    Aug. 3, 2017

Related U.S. Application Data

(63) Continuation of application No. PCT/JP2014/071411, filed on Aug. 13, 2014.

(51) Int. Cl.
*H01L 35/32* (2006.01)
*G01D 11/30* (2006.01)
(Continued)

(52) U.S. Cl.
CPC .............. *H01L 35/32* (2013.01); *G01D 11/30* (2013.01); *H01L 35/30* (2013.01); *H01L 35/34* (2013.01);
(Continued)

(58) Field of Classification Search
CPC ...................................................... H01L 35/32
See application file for complete search history.

(56) References Cited

U.S. PATENT DOCUMENTS

| 4,723,866 A * | 2/1988 | McCauley .......... E02D 29/1427 404/25 |
| 2003/0078015 A1* | 4/2003 | Laetsch .............. H05K 7/20445 455/90.3 |

(Continued)

FOREIGN PATENT DOCUMENTS

| JP | H11-025384 A | 1/1999 |
| JP | H11-128791 | 5/1999 |

(Continued)

OTHER PUBLICATIONS

Office Action of Japanese Patent Application No. 2016-542483 dated Oct. 31, 2017 (3 Sheets, 3 Sheets translation, 6 Sheets total).
(Continued)

*Primary Examiner* — Amine Benlagsir
(74) *Attorney, Agent, or Firm* — Kratz, Quintos & Hanson, LLP

(57) ABSTRACT

There is provided a sensor system capable of being used semi-permanently in a maintenance-free state without exchanging batteries as well as being installed in an already-existing manhole lid by a simple work on the spot, and having a measurement unit, a power source unit, and a communication unit, and installed in a manhole lid, wherein the power source unit includes a thermoelectric power generation module configured to generate electric power by a difference in temperature between a first heat transfer unit thermally connected to the manhole lid and a second heat transfer unit thermally connected to a heat radiating unit within a manhole, and the measurement unit and the communication unit are driven by electric power generated by the thermoelectric power generation module and measurement data of the measurement unit is transmitted to the outside via the communication unit.

15 Claims, 11 Drawing Sheets

(51) Int. Cl.
*H01L 35/30* (2006.01)
*H01L 35/34* (2006.01)
*H04Q 9/00* (2006.01)

(52) U.S. Cl.
CPC ........... *H04Q 9/00* (2013.01); *H04Q 2209/40* (2013.01); *H04Q 2209/88* (2013.01)

(56) References Cited

U.S. PATENT DOCUMENTS

2006/0261941 A1* 11/2006 Drake .................. G01F 15/063 340/539.26
2008/0258694 A1* 10/2008 Quist ...................... F03G 7/005 322/2 R
2014/0196758 A1   7/2014 Kamimura
2016/0047706 A1*  2/2016 Maruta ................. G01M 3/243 73/49.1

FOREIGN PATENT DOCUMENTS

| | | |
|---|---|---|
| JP | 2002-054167 A1 | 2/2002 |
| JP | 2003-142909 A1 | 5/2003 |
| JP | 2005-301418 A1 | 10/2005 |
| JP | 2008-109556 A1 | 5/2008 |
| JP | 2011-128791 A1 | 6/2011 |
| JP | 2014-080850 A1 | 5/2014 |
| JP | 2014-138102 A1 | 7/2014 |

OTHER PUBLICATIONS

International Search Report for International Application No. PCT/JP2014/071411 (5 Sheets, 4 Sheets translation, 9 Sheets total) dated Sep. 16, 2014.
Written Opinion of the International Searching Authority for International Application No. PCT/JP2014/071411 (6 Sheets, 3 Sheets translation, 9 Sheets total) dated Sep. 16, 2014.

* cited by examiner

WHEN INSERTED

AFTER INSERTION

SENSOR → BASE STATION

SENSOR → DEDICATED DEVICE (SMARTPHONE, TABLET) → BASE STATION

SENSOR → RELAY → BASE STATION

SENSOR → DEDICATED DEVICE (SMARTPHONE, TABLET) (WIRED)

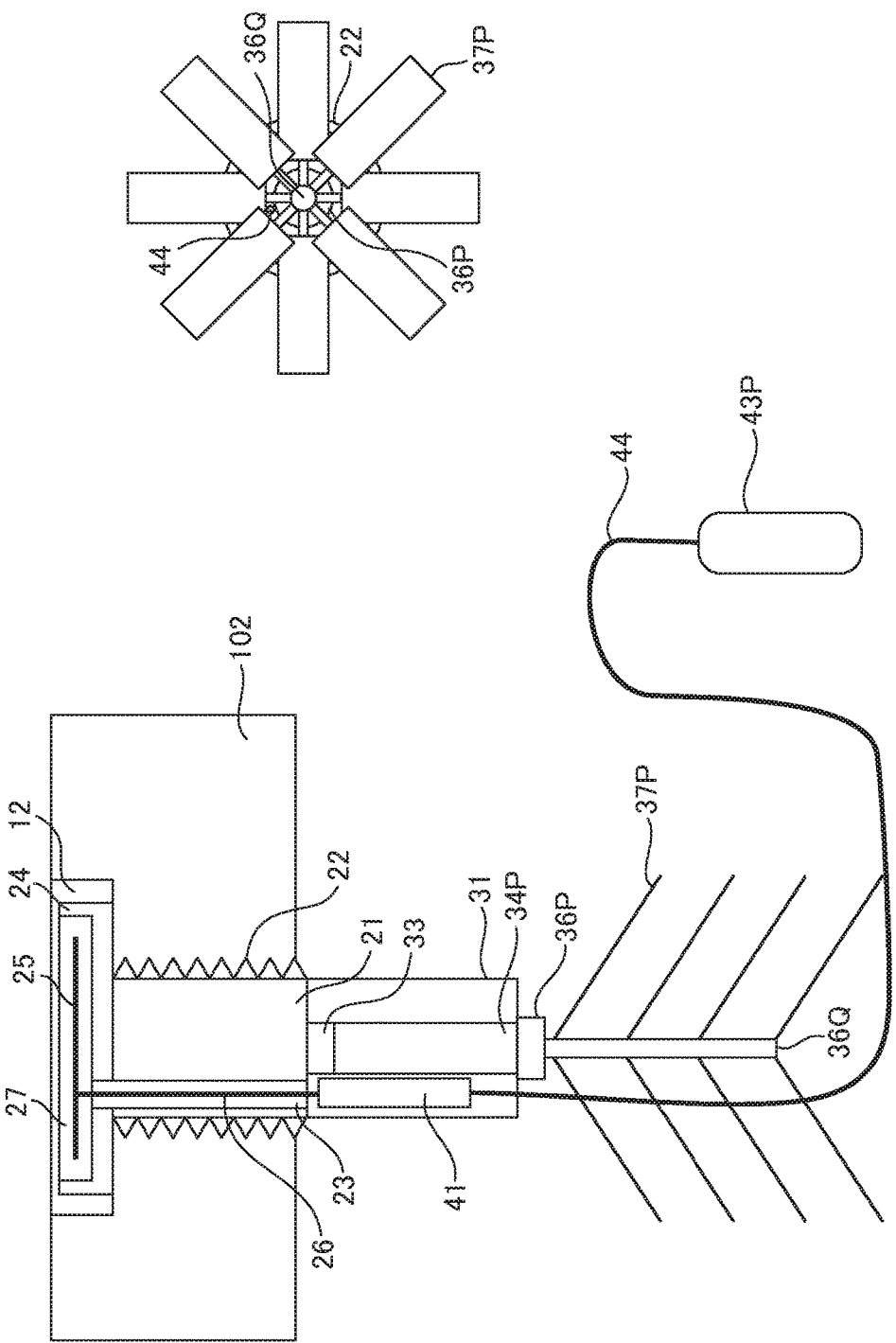

AMR SENSOR

SENSOR MODULE AND MANHOLE INFORMATION COLLECTION/PROCESSING SYSTEM

CROSS-REFERENCE TO RELATED APPLICATION

This application is based upon and claims the benefit of priority of the prior International Application PCT/JP2014/071411, filed on Aug. 13, 2014, the entire contents of which are incorporated herein by reference.

FIELD

The present invention relates to a sensor module in a manhole lid, a fixing method thereof, a manhole information collection and processing system, and a manhole information processing method.

BACKGROUND

Water supply, sewerage, gas, electric power and communication networks are established all over urban areas, and manholes are provided for maintenance of the networks. It is difficult to observe the interior of a manhole from the ground, and therefore an operator opens the manhole lid in order to observe the interior of the manhole. Since the operational load for observing the interior of a manhole is high, the interior of a manhole is not always observed every time.

Although the combined system sewerage or the rainwater sewerage network prevents submergence of roads by quickly guiding rainwater that flows from roads at the time of rainfall to the sewage treatment plant, when the amount of rainfall is larger than the amount that may be treated in a short time, damage, such as submergence and inundation of a road, will occur. In recent years, localized torrential rain occurs frequently and countermeasures against the rain become more and more important. When the amount of rainfall is larger than the amount that may be treated, first, a large amount of rainwater flows into the conduit from the street rain inlet and the manhole, then the water level of the conduit and the manhole rises, and finally the water overflows from the manhole lid. Conventionally, the possibility of inundation and the degree of inundation can be predicted based on the amount of rainfall, and an advisory and a warning are issued to each area. However, it is desirable to observe the actual condition within the manhole in order to accurately observe the condition. However, in such a condition, since it is not easy to observe the condition within the manhole while ensuring the safety of an operator, a large amount water flows in the manhole and it is difficult for an operator to actually open the manhole lid and check the condition inside the manhole, and therefore the interior of the condition within the manhole is not observed.

It has been proposed to arrange various sensors within the manhole and to collect information on the manhole. It is desirable to arrange a large number of sensors and to collect detection data thereof, in order to observe the condition within the manhole. However, it is expensive in order to arrange a large number of sensors, and to construct and maintain a sensor system for collecting detection data from the large number of arranged sensors.

It has been proposed to provide a measurement device (sensor module) having a wireless communication device including an antenna in the manhole lid and to collect detection data of the sensor module by wireless communication.

In general, the combined system manhole lid and the rainfall manhole lid have holes to release overflowed water onto a road when water overflows within the manhole. Patent Document 1 discloses a sensor module having a wireless communication device, which may be installed in the hole or which may be installed only by performing simple processing around the hole of the manhole lid. Although it is desirable that a power source is provided in order for the sensor module to perform the detection operation and to transmit detection data by wireless communication, Patent Document 1 does not at all disclose a power source for the sensor module.

Patent Document 2 discloses a sensor module that is installed in the manhole lid and which performs wireless communication by using a space within the sewage conduit. Patent Document 2 discloses a power source for the sensor module including a battery and wind power generation device or a battery and solar power generation device. However, Patent Document 2 does not disclose a structure to install the sensor module in the manhole lid or an attachment structure with a wireless communication device that is arranged at the position of the sewage conduit to the manhole lid.

Although the sensor module disclosed in Patent Document 2 mounts a battery, the battery has a lifetime, and therefore the operation for exchanging batteries is a big problem. Normally, a manhole is opened for several years, and therefore the operation for exchanging batteries is difficult. Patent Document 2 describes usage of solar power generation or wind power generation. However, the surface of a manhole has bumps and dips for preventing slip, and it is difficult to install the solar battery, and the solar battery is apt to become stained soon, and therefore the solar battery is not actually effective. Further, in general, the distance between the manhole lid and the position of the top of the sewage conduit is quite long. Therefore, in actuality, the wireless communication device and the wind power generation device are arranged on the top of the sewage conduit and the rest of the sensor module is arranged in the manhole lid, and the rest connects with the wind power generation device. However, Patent Document 2 does disclose a connection structure of the arrangement and an attachment structure of the sensor module to the manhole lid. When such a connection structure is actually implementing, it is predicted that the sensor module increases in size. Therefore, it is difficult to install the sensor module of Patent Document 2 by using the already-existing hole of a manhole lid as described in Patent Document 1.

Further, although the wind power generation device has a mechanical mechanism including a rotating system, the environment within such a manhole of sewage is a poor environment in which the concentration of a corrosive gas, such as hydrogen sulfide, is high, and therefore it is difficult to maintain the operation state of the mechanical device having a rotating system for a long period of time.

As above, in order to take effective countermeasures by observing the condition within a manhole, it is desirable to arrange a large number of sensor modules in the manhole and to collect data. Therefore, it is desired that the sensor module be easily installed and the maintenance cost may become low. Although the sensor module is supplied with a power source, for the reasons described above, it is difficult to provide a wire that supplies a power source to the sensor module, and therefore a battery is arranged in the sensor module, and it is desirable that the sensor module may be used for a long period of time without performing maintenance, such as exchange of batteries.

As described above, a sensor system that is easily attached and which is not maintained, such as exchange of batteries, for a long period of time has not been implemented.

RELATED DOCUMENTS

[Patent Document 1] Japanese Laid Open Patent Document No. 2008-109556
[Patent Document 2] Japanese Laid Open Patent Document No. 2011-128791

A sensor module of a first aspect has a measurement unit, a power source unit, and a communication unit and is installed in a manhole lid. The power source unit includes a thermoelectric power generation module configured to generate electric power by a difference in temperature between a first heat transfer unit thermally connected to a manhole lid and a second heat transfer unit thermally connected to a heat radiating unit within a manhole. The sensor module drives the measurement unit and the communication unit by the electric power generated by the thermoelectric power generation module and transmits measurement data of the measurement unit to the outside via the communication unit.

A manhole information collection and processing system of a second aspect has a plurality of sensor modules installed in a plurality of manhole lids, a server that collects and processes data of a plurality of sensor modules, and a wireless communication network. Each sensor module has a thermoelectric power generation module configured to generate electric power by a difference in temperature between a first heat transfer unit thermally connected to a manhole lid and a second heat transfer unit thermally connected to a heat radiating unit within a manhole, and a wireless communication unit. The wireless communication network connects the plurality of sensor modules and the wireless communication units of the plurality of sensor modules to the server so as to be capable of communication.

Advantageous Effect of the Invention

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF DRAWINGS

FIG. 8A illustrates a sectional diagram of a state where a sensor module of a third embodiment is attached into a manhole lid;
FIG. 8B illustrates a diagram viewed from below of a state where a sensor module of a third embodiment is attached into a manhole lid.

DESCRIPTION OF EMBODIMENTS

Figure 1A:
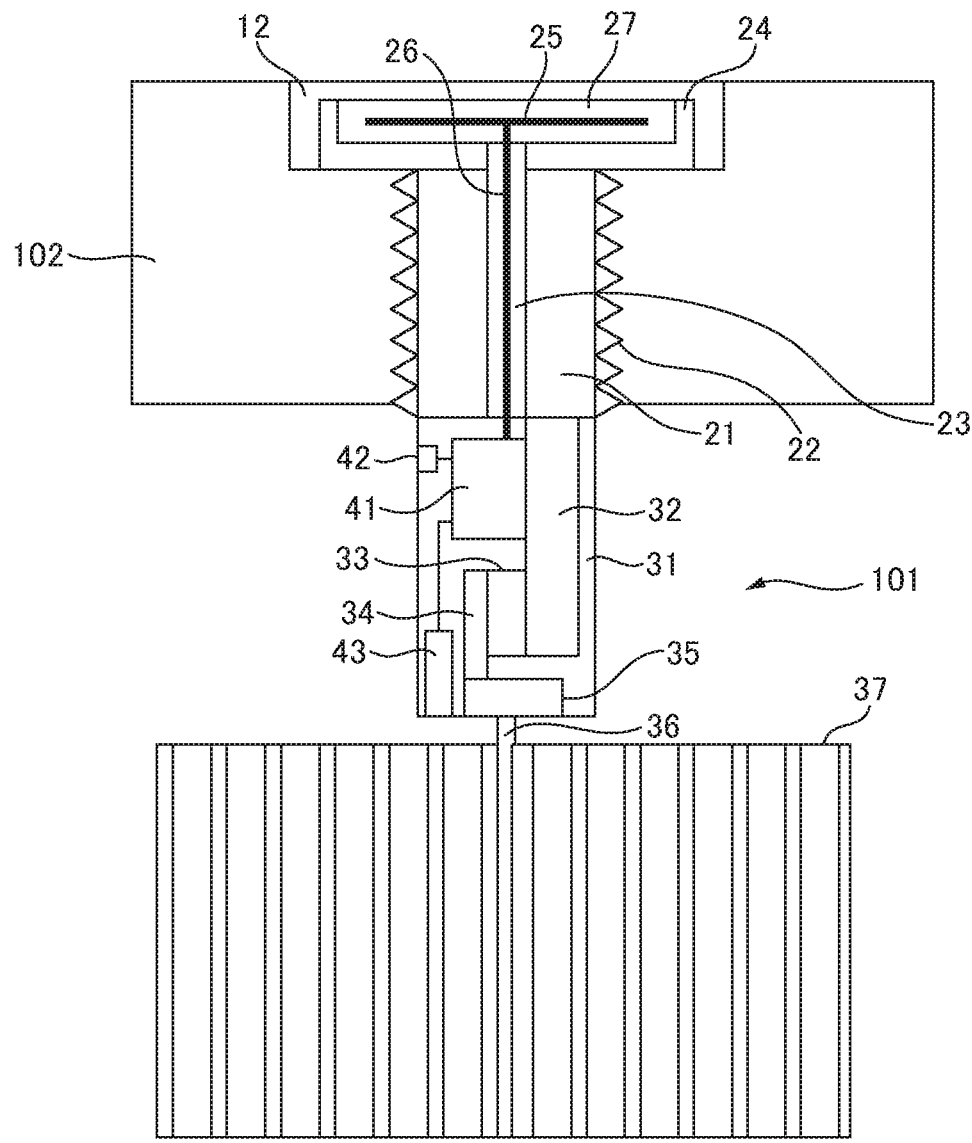
FIG. 1A illustrates a sectional diagram of a state where a sensor module of a first embodiment is attached to a manhole lid.
Figure 1B:
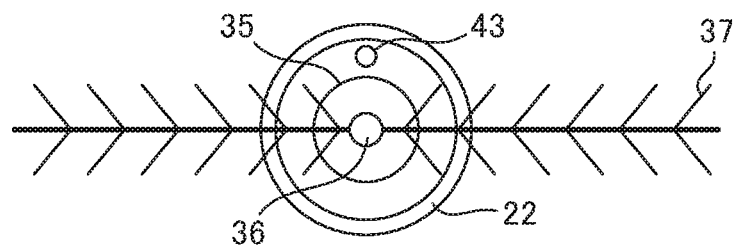
FIG. 1B illustrates a diagram viewed from below a state where a sensor module of a first embodiment is attached to a manhole lid.

FIG. 1A and FIG. 1B are each a diagram illustrating a state where a sensor module of a first embodiment is attached to a manhole lid, and FIG. 1A illustrates a sectional diagram and FIG. 1B illustrates a diagram viewed from below.

A sensor module 101 is fixed to a manhole lid 102 by forming a thread in an already-existing hole of the manhole lid 102 as a screw hole and screwing the sensor module 101 from the top of the manhole lid 102. In general, the combined system manhole lid 102 and the rainwater manhole lid 102 are provided with a plurality of holes as a path through which water flows out onto a road from within the manhole in order to prevent the manhole lid 102 from being lifted by water pressure. Further, there are protruding and recessed portions on the surface of the manhole lid 102 and there is a hole provided in the recessed portion. Although it is desirable for the hole to which the manhole lid 102 is attached in the embodiment to be a hole provided in a recessed portion 12, no problem occurs even if the recessed portion 12 does not exist.

In general, the diameter of the hole provided in the manhole lid 102 is, for example, about 15 mm. Then, one of the plurality of holes is formed as a screw hole. When the manhole lid 102 is already provided with a screw hole, the screw hole may be used. When the manhole lid 102 does not have a hole provided in the recessed portion 12, a cylindrical recessed portion may be additionally formed on the manhole lid 102. Further, when the manhole lid 102 does not have a hole suitable for attaching the sensor module 101, both a screw hole and a recessed portion may be formed on the top of the manhole lid 102. The screw hole is a comparatively simple formed and the screw hole may be easily formed at the installation place of the manhole lid. Thus, the sensor module of the embodiment may be easily attached to an already-existing manhole. On the other hand, hole on the manhole lid may be formed in a factory of the manhole lid. In the specification, explanation is given on the assumption that the screw hole is for a 20M screw.

The sensor module 101 has a heat transfer body base unit 21, a bolt unit 22 formed on the side surface of the heat transfer body base unit 21, a through-hole 23 formed in the heat transfer body base unit 21, and a collar 24 formed on the top of the heat transfer body base unit 21. On the top of the collar 24, a counterbore hole is formed. The bolt unit 22 is an M20 male screw. The sensor module 101 is screwed at the position at which the collar 24 comes into contact with the surface of the manhole lid 102, by screwing the sensor module 101 into the screw hole of the manhole lid 102. As illustrated in FIG. 1A, it is desirable that the height of the collar 24 is less than the height of the recessed portion 12 of the manhole lid 102, and the top surface of the collar 24 is lower than the circumference of the manhole lid 102 in the state of being screwed.

An antenna 25 is provided in the counterbore hole of the collar 24, and an antenna line 26 is provided in the through-hole 23 formed in the heat transfer body base unit 21. As the antenna 25, although antennas having various shapes in accordance with the wireless scheme may be used, it is preferable that the antenna 25 is compact, since the antenna 25 is installed in the manhole lid 102 and desirably, the antenna 25 is a dielectric antenna.

The sensor module 101 further has, under the heat transfer body base unit 21, a first heat transfer body 32, a thermoelectric element 33, second heat transfer bodies 34 and 35, a heat radiating unit axis 36, a heat radiating unit 37, an electronic circuit 41, a temperature/humidity sensor 42, and a water level sensor 43. The first heat transfer body 32 is in thermal contact with the heat transfer body base unit 21 and further thermally connects to the manhole lid 102 via the bolt unit 22 on the side surface of the heat transfer body base unit 21 (having a high thermal conductivity). The heat transfer body base unit 21 and the first heat transfer body 32 are together referred to as a first heat transfer unit. The temperature of the first heat transfer unit, i.e., the temperature of the first heat transfer body 32 becomes temperature approximate to the temperature of the manhole lid 102. It is desirable that the heat transfer body base unit 21 and the first heat transfer body 32 are made of ductile cast iron like the manhole lid 102, but the material is not limited to this as long as the material has a high thermal conductivity and a high mechanical strength, such as beryllium copper.

The second heat transfer bodies 34 and 35, the heat radiating unit axis 36, and the heat radiating unit 37 are thermally connected, and therefore the temperature thereof is similar. The second heat transfer bodies 34 and 35 are together referred to as a second heat transfer unit. The second heat transfer bodies 34 and 35 and the heat radiating unit axis 36 are made of, for example, ductile cast iron or beryllium copper. The heat radiating unit 37 has a heat radiating fin that functions as a heat sink. For example, the sensor module 101 has a length of 100 mm, and the length of the heat radiating fin is 50 mm. The heat radiating fin has two portions that expand toward both sides of the heat radiating unit axis 36, and each portion has a length of 50 mm in the vertical direction and a length of 50 mm in the horizontal direction. Thus, the heat radiating fin has a size of 50 mm×100 mm by combining both. One portion has a shape in which an elastic sheet to both sides of which a graphite sheet having a thickness of 50 μm is bonded to the surface of a beryllium copper sheet having a thickness of 50 μm, and further, a graphite sheet having a width of 10 mm and a thickness of 50 μm is bonded to both sides of the beryllium copper sheet at 10 mm intervals. The heat radiating unit 37 uses a beryllium copper sheet having elasticity as a material and may enter a state of being wound around the heat radiating unit axis 36 and in a free state, the heat radiating unit 37 enters an expanded state as illustrated in FIGS. 1A and 1B. The heat radiating unit 37 is held within the manhole and has a wide surface area, and therefore the temperature of the heat radiating unit 37 becomes that close to the temperature within the manhole compared to the first heat transfer unit. Thus, the temperature of the second heat transfer body 34 also becomes that close to the temperature of the air within the manhole compared to the first heat transfer unit.

Further, the heat radiating unit 37 may be implemented by combining a laminated material in which a plurality of materials is laminated, and furthermore, the heat radiating unit 37 may be implemented by using a shape-memory alloy, or the heat radiating unit 37 may expand by its own power by attaching a plate spring or a coiled spring to the heat radiating fin.

The thermoelectric element 33 generates electric power in accordance with the difference in temperature between the first heat transfer body 32 and the second heat transfer body 34, i.e., the difference in temperature between the manhole lid 102 and the air within the manhole. When the difference becomes larger, the amount of the generated electric power becomes larger. The electric power generated by the thermoelectric element 33 is stored in a step-up circuit and an electricity storage element provided in the electronic circuit 41 and used to drive the electronic circuit 41, the temperature/humidity sensor 42, and the water level sensor 43.

As the thermoelectric element 33, it is desirable to use a common thermoelectric power generation element called a π type in which an n-type material and a p-type material are arranged alternately, which use a BiTe-based material whose power generation efficiency in the vicinity of the ambient temperature is high, and for example, a BiTe-based element in the shape of a square whose one side is 10 mm long. However, any thermoelectric power generation element may be used and not limited to this. The thermoelectric power generation element is a solid element without a mechanical element and continues to generate electric power without being affected by stain and without deterioration of the characteristics over a long period of time. The difference in temperature between the manhole lid 102 and the air within the manhole changes between day and night, depending on the weather, the sewage conditions, etc., and sometimes one of them is higher than the other and sometimes this relationship is reversed, but the thermoelectric element 33 generates electric power provided there is a difference in temperature irrespective of the direction of the difference in temperature. The amount of electric power that is generated varies in accordance with the difference in temperature, and therefore it is desirable that a secondary battery that serves as a buffer for temporarily storing electric power is arranged, however the output is stable for a period of time, for example, about one week, and therefore the sensor module 101 may operate semi-permanently with a secondary battery capable of storing electric power for about one week.

The electronic circuit 41 has a secondary battery that serves as a buffer for temporarily storing electric power and reads detection data of the temperature/humidity sensor 42 and the water level sensor 43 and stores the detection data in a memory. The antenna 25 is connected to a wireless circuit of the electronic circuit 41 via the antenna line 26. The electronic circuit 41 occasionally transmits the stored detection data to the outside by wireless communication via the antenna line 26 and the antenna 25. The configuration of the electronic circuit 41 will be described later.

The temperature/humidity sensor 42 is a common semiconductor sensor and detects the temperature and humidity within the manhole. The water level sensor 43 is an optical water level sensor and has a light emission unit configured to radiate light (infrared) beams toward the water surface within the manhole, a light detection unit configured to detect returned light beams reflected from the water surface, and a calculation unit configured to calculate the distance to the water surface from the time taken by the light beams to travel to and from the water surface.

In the first embodiment, the example is illustrated in which the temperature/humidity sensor 42 and the water level sensor 43 are mounted, but the sensors that are mounted are not limited to those, and various sensors, such as a gas (hydrogen sulfide, ammonia, carbon monoxide, carbon dioxide, etc.) concentration sensor may be mounted, a flow rate sensor, and a vibration sensor. Further, a part or all of those sensors may be mounted.

A portion 31 including the first heat transfer body 32, the thermoelectric element 33, the second heat transfer bodies 34 and 35, the electronic circuit 41, the temperature/humidity sensor 42, and the water level sensor 43 on the lower side of the heat transfer body base unit 21 is sealed with a sealing resin. The outer diameter of the portion 31 is smaller than the outer diameter of the base of the bolt unit 22 of the heat transfer body base unit 21, and therefore the portion 31 passes through the screw hole of the manhole lid.

Further, the counterbore hole of the collar 24 in which the antenna 25 is provided and the through-hole 23 in which the antenna line 26 is provided are also sealed with the sealing resin.

Preferably, the sealing resin is a resin excellent in anti-corrosion, airtightness, and formability and a mold resin for semiconductor is suitable. However, preferably, thermal conductivity is low, and therefore a resin not including a filler of ceramic particles is preferable. However, a filler having a low thermal conductivity, such as hollow silica particles may be used. In the first embodiment, the through-hole 23, the antenna 25, the antenna line 26, the first heat transfer body 32, the thermoelectric element 33, the second heat transfer bodies 34 and 35, the electronic circuit 41, the temperature/humidity sensor 42, and the water level sensor 43 are sealed with an epoxy-based resin by using an insert mold.

Next, a procedure to install the sensor module 101 of the first embodiment in the manhole lid 102 is explained.

A screw hole for M20 screw is formed in the hole having a diameter of about 15 mm formed in the recessed portion 12 of the manhole 102. If a screw hole for M20 screw is formed as described previously, the screw hole may be used, and if the recessed portion 12 does not exist or the height of the recessed portion 12 is not suitable for a screw hole for M20 screw, the screw hole for M20 screw is formed after additionally forming the recessed portion 12 and a hole. These works may be performed without the opening the manhole lid 102.

As described previously, the heat radiating fin of the heat radiating unit 37 uses the beryllium copper sheet having elasticity as a material, and the heat radiating fin may be brought into a state of being wound around the heat radiating unit axis 36, and when the heat radiating fin is brought into a free state, the heat radiating fin enters an expanded state.

Figure 2A:
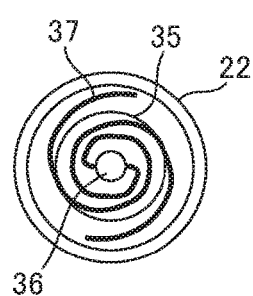
FIG. 2A illustrates a state where the heat radiating fin of a heat radiating unit.
Figure 2B:
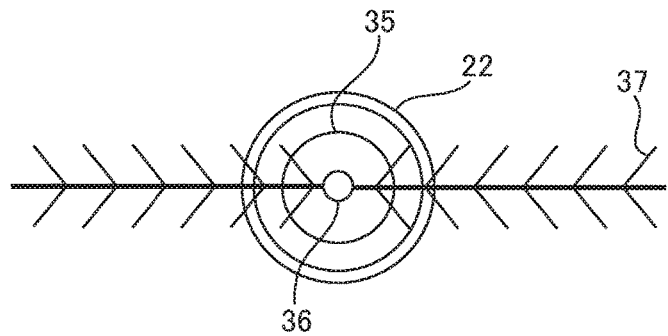
FIG. 2B illustrates a free state of a heat radiating unit.

FIGS. 2A and 2B illustrate two states of the heat radiating unit 37 and FIG. 2A illustrates a state where the heat radiating fin of the heat radiating unit 37 is wound around the heat radiating unit axis 36 and FIG. 2B illustrates a free state, i.e., an expanded state.

When the sensor module 101 is installed in the manhole lid 102, the heat radiating fin of the heat radiating unit 37 is brought into a state where the radiating fin of the heat radiating unit 37 is wound around the heat radiating unit axis 36 as illustrated in FIG. 2A. At this time, the heat radiating fin is located inside the outer diameter of the bolt unit 22 of the heat transfer body base unit 21. In this state, if the heat radiating unit 37 is inserted into the screw hole from the upper side of the manhole lid 102, the heat radiating unit 37 may be inserted as it is, and after the top of the heat radiating unit 37 comes out of the lower side of the screw hole, the heat radiating fin of the heat radiating unit 37 expands as illustrated in FIG. 2B, since the heat radiating fin has elasticity. In this manner, the heat radiating fin automatically enters the expanded state after passing through the screw hole. Further, the bolt unit 22 is screwed to the screw hole and fixed firmly by rotating the sensor module 101. In this manner, the installation of the sensor module 101 into the manhole lid 102 is completed and the heat radiating unit 37 has a wide heat radiating area and exhibits a high heat radiating effect.

The above series of installation work may be performed without opening the manhole lid 102. Thus, the work is simple and the work may be completed within a short time.

Next, the electronic circuit 41 is explained.

Figure 3:
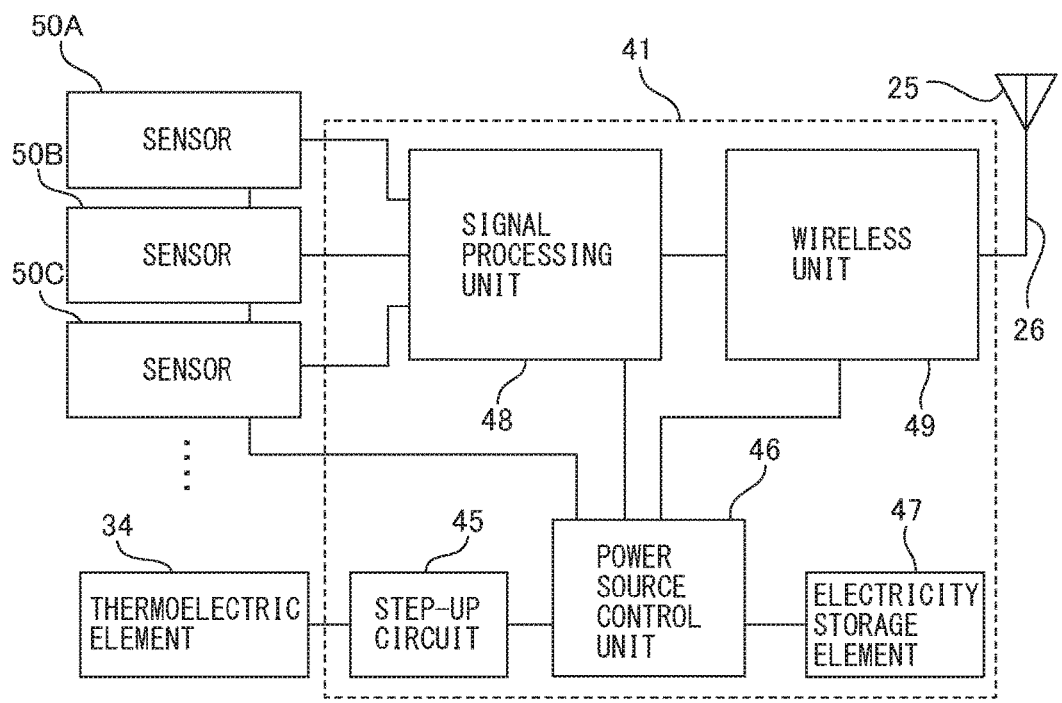
FIG. 3 is a block diagram illustrating a function configuration of the sensor module including the electronic circuit.

FIG. 3 is a block diagram illustrating a function configuration of the sensor module 101 including the electronic circuit 41.

The electronic circuit 41 has a step-up circuit 45, a power source control unit 46, an electricity storage element 47, a signal processing unit 48, and a wireless unit 49. To the step-up circuit 45, the thermoelectric element 33 is connected and the generated electric power is supplied. To the signal processing unit 48, a plurality of sensors 50A, 50B, 50C, . . . is connected. In the first embodiment illustrated in FIG. 1, as the sensors 50A and 50B, the temperature/humidity sensor 42 and the water level sensor 43 are connected, but the number of sensors that are connected is not limited. To the wireless unit 49, the antenna 25 is connected via the antenna line 26.

With the electric power generated by the thermoelectric element 33, the voltage that occurs is as low as several mV, and therefore the step-up circuit 45 steps up the electric power generated by the thermoelectric element 33 to several V and supplies the stepped-up electric power to the power source control unit 46. The power source control unit 46 supplies the electric power supplied from the thermoelectric element 33 to the sensors 50A to 50C, the signal processing unit 48, and the wireless unit 49, but the electric power supplied from the thermoelectric element 33 is not stable, and therefore the power source control unit 46 also has a function to store electric power in the electricity storage element 47 in accordance with the necessity. Although not illustrated, the power source control unit 46 also has a stabilized power source circuit for supplying stabilized electric power to the sensors 50A to 50C, the signal processing unit 48, and the wireless unit 49.

It is desirable that the electricity storage element 47 is an element that is safe and compact, whose leak current is small, and which has a long lifetime, and for example, an all-solid Li thin-film secondary battery is suitable. The electricity storage element 47 may be implemented by combining a secondary battery and a capacitor.

As described previously, as the sensors 50A, 50B, 50C, . . . , various sensors may be used, and specifically, the sensors 50A, 50B, 50C, . . . are sensors that detect temperature, humidity, a concentration of gas (hydrogen sulfide, ammonia, carbon monoxide, carbon dioxide, etc.), a water level, a flow rate, vibration, etc. Further, the sensors 50A, 50B, 50C, . . . may be sensors that sense pressure, light, sound, an electromagnetic wave, acceleration, fine particles in the atmosphere, a distance to an object, a weight of an object, etc.

The signal processing unit 48 performs A/D (Analog-to-Digital) conversion of the detection signals from the sensors 50A, 50B, 50C, . . . and temporarily stores the detection signals in a memory as detection data. The signal processing unit 48 also has a function to perform control of the whole of the system, such as control of sensing and control of timing of wireless transmission/reception, and transmits the detection data stored in a memory to the outside from the antenna 25 by wireless communication. Further, the signal processing unit 48 may perform a predetermined arithmetic operation by using, for example, various kinds of information sensed by the sensors 50A, 50B, 50C, . . . and to transmit the calculated secondary information to the outside.

The wireless unit 49 may have a function to receive a signal from the outside in accordance with the necessity as well as wirelessly transmitting detection data. Specified low power radio, ZigBee, Bluetooth (registered trademark), Wi-Fi, 3G, LTE, etc., may be used as the wireless scheme as necessary. The wireless unit 49 may be compatible with a plurality of wireless schemes. In the first embodiment, the transmission frequency is 2.4 GHz and the transmission output is 20 mW. Further, a communication terminal for wired communication may be provided in place of the wireless unit 49.

As the antenna 25, various kinds may be used in accordance with the wireless scheme, but it is preferable that the antenna 25 is compact, since the antenna 25 is installed in the manhole lid 102 and a dielectric antenna is suitable. In the first embodiment, the antenna 25 is a dielectric antenna compatible with 2.4 GHz.

Next, a system is explained in which the sensor module 101 of the first embodiment is installed in a plurality of manhole lids and a server collects detection data of the plurality of sensor modules 101 installed in the plurality of manhole lids via a wireless line.

Figure 4:
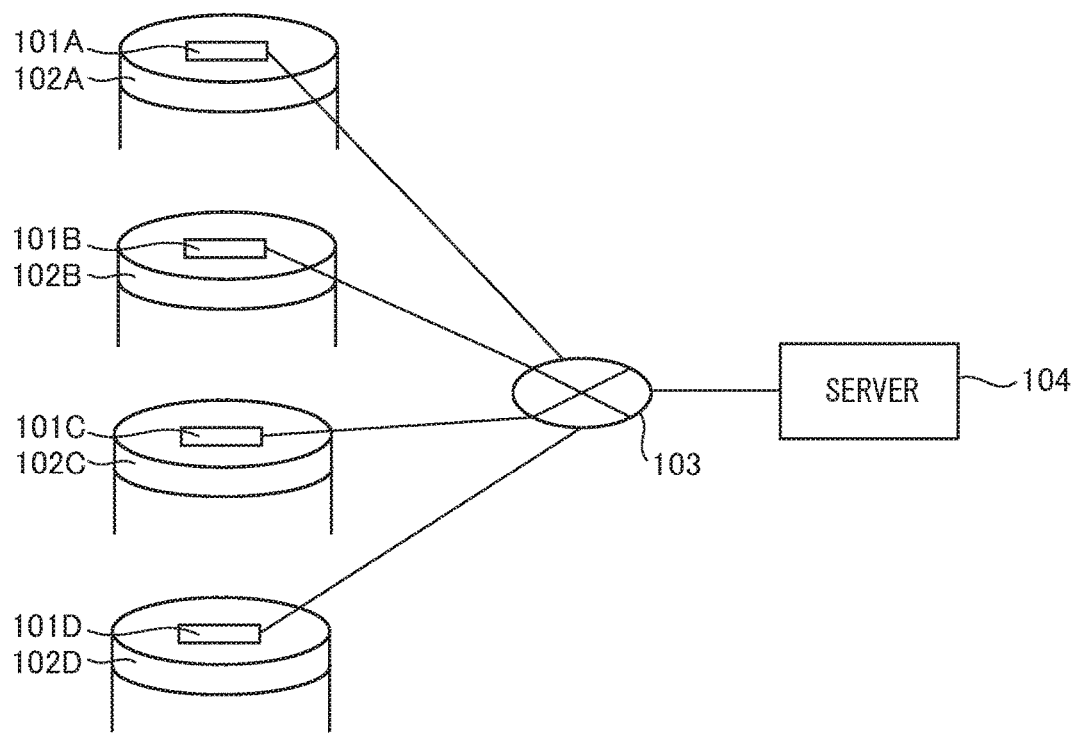
FIG. 4 is an outline configuration diagram of a system for collecting manhole information by using the sensor module of the first embodiment.

FIG. 4 is an outline configuration diagram of a system for collecting manhole information by using the sensor module 101 of the first embodiment.

This system has a plurality of sensor modules 101A to 101D installed in a plurality of manhole lids 102A to 102D, a network 103, and a server 104. Although the example of the four sensor modules 101A to 101D is illustrated, a large number of sensor modules are provided in actuality.

Each of the sensor modules 101A to 101D is arranged in each of the manhole lids 102A to 102D as in FIG. 4. In FIG. 4, the sensor modules 101A to 101D and the network 103 are connected by solid lines, but in actuality, each of the sensor modules 101A to 101D wirelessly transmits detection data to a receiver (base station) connected to the network 103. The server 104 collects detection data transmitted via the network 103. The transmission of detection data from each of the sensor modules 101A to 101D may be performed periodically or performed in response to a request from the server 104. When the detection data is periodically transmitted, the signal processing unit 48 of the sensor modules 101A to 101D has a timer and transmits detection data on detecting that a fixed time has elapsed. When the detection data is transmitted in response to a request from the server 104, it is desirable for the wireless unit 49 of the sensor modules 101A to 101D to have a reception function.

For example, the sensor modules 101A to 101D are set so as to measure the temperature/humidity and the water level every hour or every day and to wirelessly transmit them and the detection data is received by a receiver installed at a position about 10 m apart from the manhole. The receiver transmits the received detection data to the server 104 in a monitoring room located apart via the already-existing 3G line network 103. the detection data may be monitored in the monitoring room.

There are various communication configurations between the sensor module 101 and the server 104 and a variety of configurations may be enabled in the future in accordance with the construction of the communication infrastructure and the development of devices. Several examples of configurations are explained.

FIGS. 5A to 5D are each a diagram illustrating an example of a communication configuration between the sensor module 101 and the server 104.

Figure 5A:
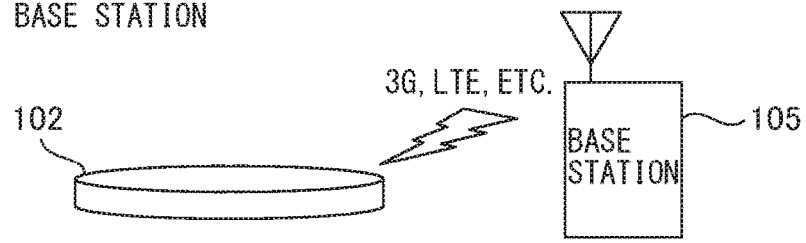
FIG. 5A is a diagram illustrating an example of a communication configuration between the sensor module and the server.

FIG. 5A illustrates a configuration in which communication is established directly by a communication scheme, such as 3G and LTE, between the sensor module installed in the manhole lid 102 and a base station 105 of the already-existing network.

Figure 5B:
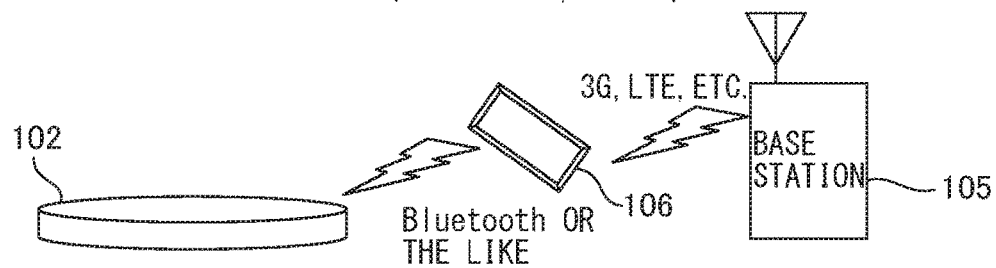
FIG. 5B is a diagram illustrating an example of a communication configuration between the sensor module and the server.

In FIG. 5B, an operator goes to the place of the manhole lid 102 whose detection data is collected and the operator requests detection data to the sensor module installed in the manhole lid 102 by the Bluetooth (registered trademark) scheme by using a dedicated device 106. The sensor module transmits detection data in response to the request and the dedicated device 106 receives and stores the detection data. On the completion of the reception of the detection data by the dedicated device 106, the operator transmits the detection data appropriately stored to the base station 105 by a communication scheme, such as 3G and LTE.

In the configuration in FIG. 5B, a measurement vehicle traveling on a road may be used as a method of collecting detection data stored in the sensor module. In this case, the measurement vehicle that mounts the dedicated device 106 at the bottom of the vehicle body requests detection data from the sensor module when passing by the manhole lid 102. The sensor module transmits the detection data in response to the request and the mounted dedicate device 106 collects the detection data. At this time, it is desirable that the dedicated device 106 stores the detection data in association with the position information on the vehicle by the GPS. The detection data collected by the server may display the recovered data on a map by combining the position information on the vehicle by the GPS and the collected detection data. When the sensor module has an ID number corresponding to the manhole lid 102, the position information on the vehicle by the GPS is not used.

As the measurement vehicle, a refuse collection vehicle operated by a municipality may be used in place of a special vehicle.

Figure 5C:
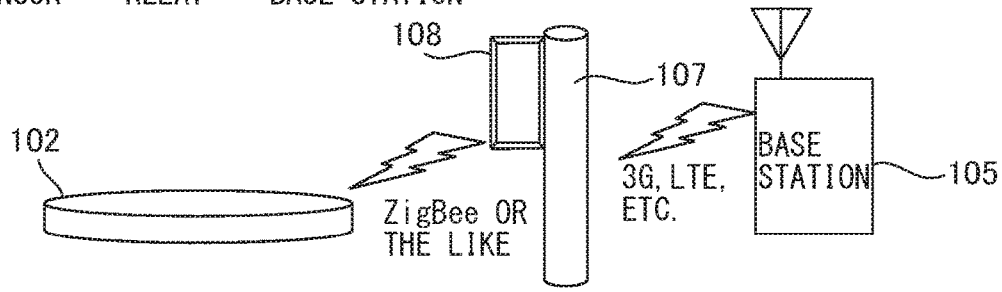
FIG. 5C is a diagram illustrating an example of a communication configuration between the sensor module and the server.

FIG. 5C illustrates a configuration in which a receiver 108 for relay is provided between the sensor module installed in the manhole lid 102 and the base station 105 of the already-existing network. The receiver 108 is installed to a utility pole 107 or the like installed near the manhole lid 102. The communication between the sensor module and the receiver 108 is performed by the ZigBee scheme or the like and the communication between the receiver 108 and the base station 105 is performed by a scheme, such as 3G and LTE.

Figure 5D:
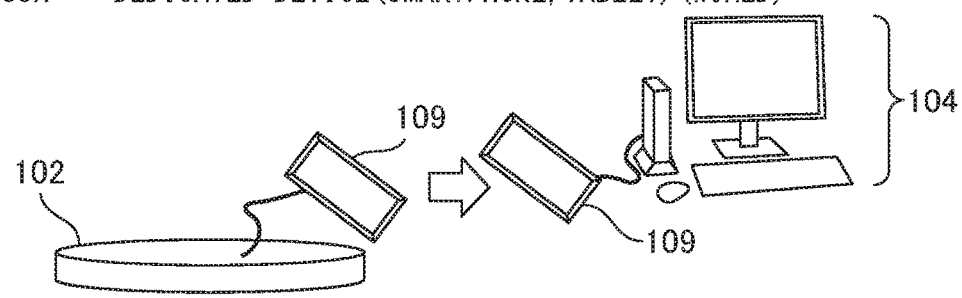
FIG. 5D is a diagram illustrating an example of a communication configuration between the sensor module and the server.

In FIG. 5D, an operator goes to the place of the manhole lid 102 whose detection data is collected and connects a dedicated device 109 having USB or the like to the communication terminal of the sensor module installed in the manhole lid 102, and reads and stores detection data. Thus, the sensor module does not have an antenna and the sensor module has a wired communication unit in place of a wireless unit. The operator connects the dedicated device 109 to the communication terminal of the computer system forming the server 104 and the server 104 reads the detection data stored in the dedicated device 109.

There are various communication configurations as described, and the communication configuration is not limited to the examples illustrated in FIGS. 5A to 5D.

As above, the sensor module of the first embodiment and the manhole information collection system that uses the sensor module are explained, but there may be various modification examples of the structure of the sensor module, the configuration of the system, etc.

Figure 6A:
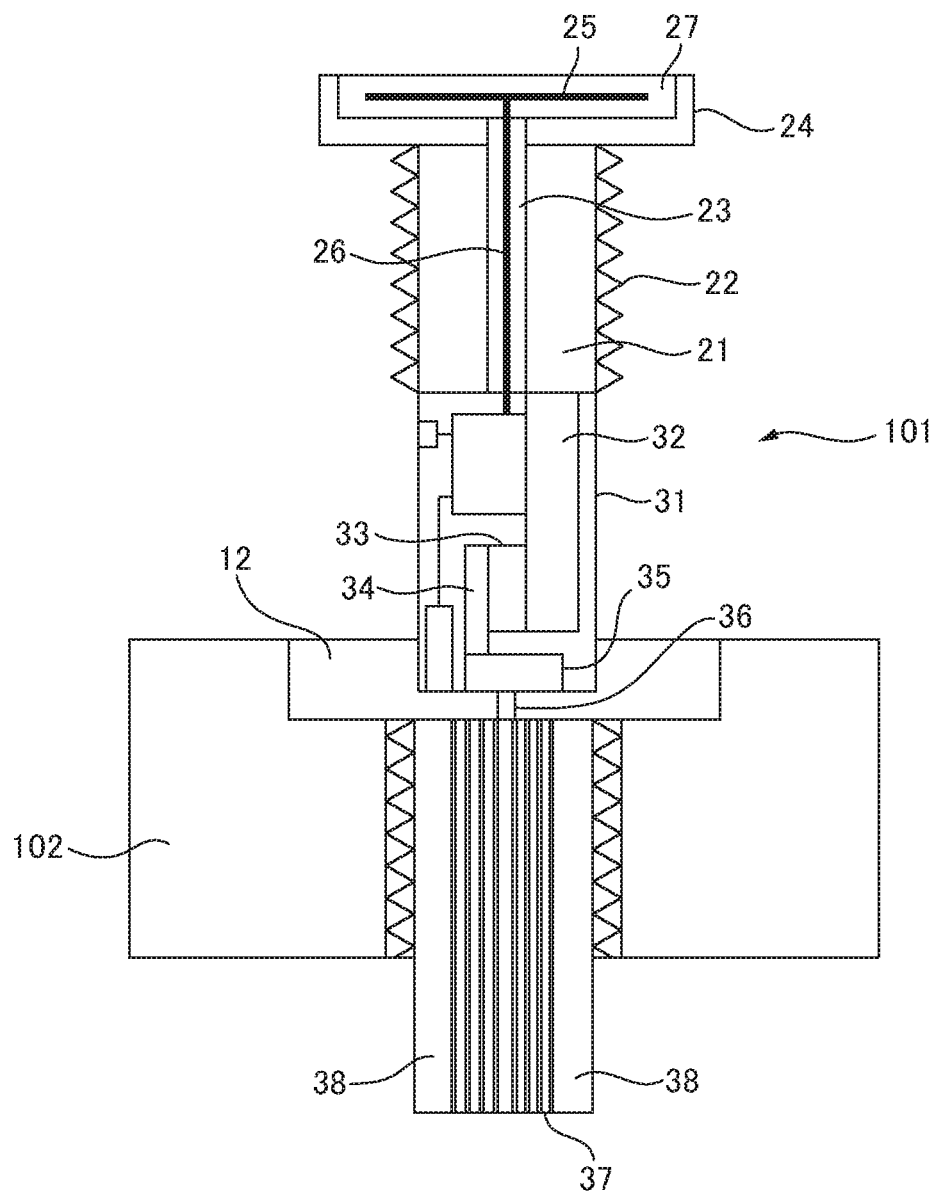
FIG. 6A illustrates a sectional diagram of a state on the way of installation of a sensor module of a second embodiment into a manhole lid.
Figure 6B:
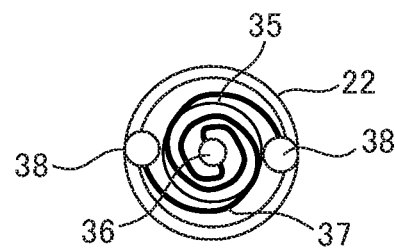
FIG. 6B illustrates a diagram viewed from below of a state on the way of installation of a sensor module of a second embodiment into a manhole lid.

FIGS. 6A and 6B are each a diagram illustrating a state on the way of installation of a sensor module of a second embodiment into a manhole lid, and FIG. 6A illustrates a sectional diagram and FIG. 6B illustrates a diagram viewed from below.

Figure 7A:
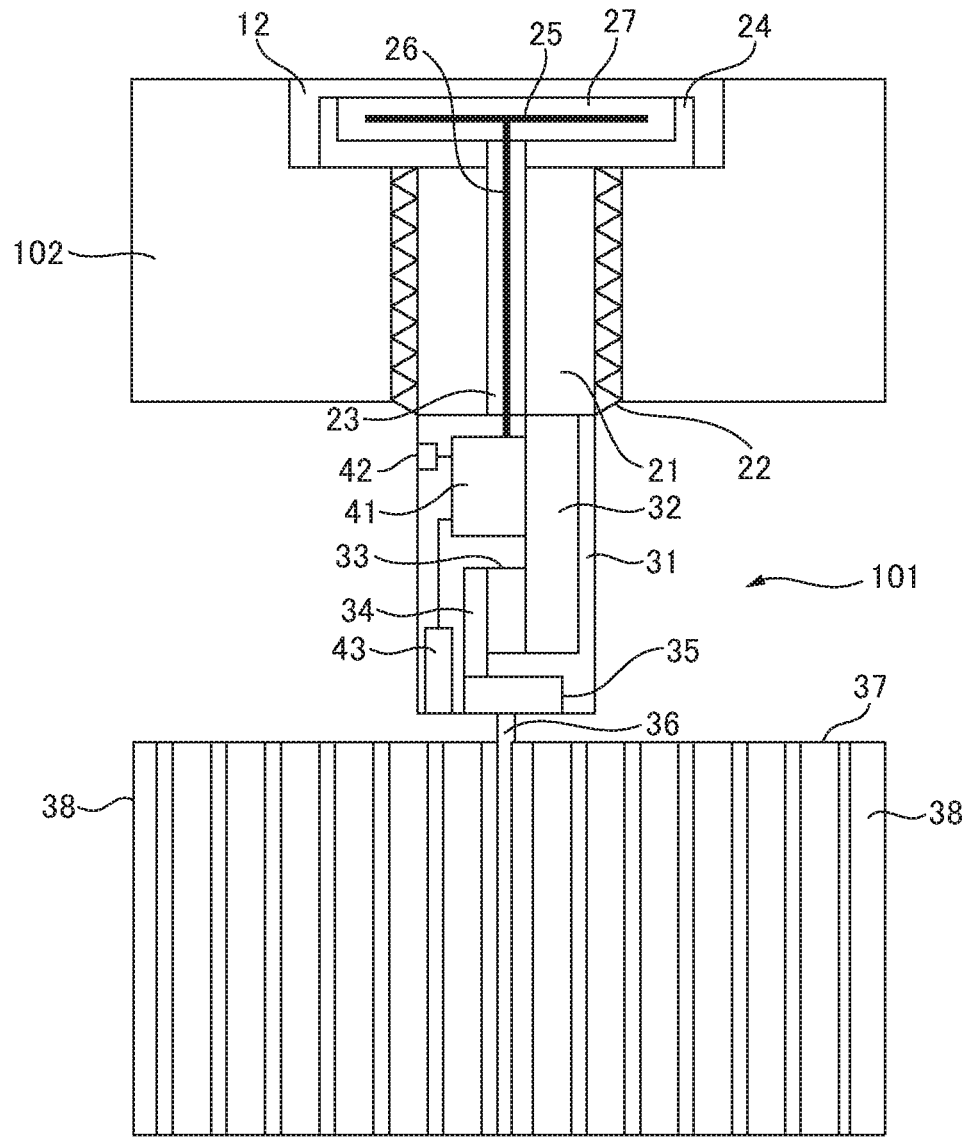
FIG. 7A illustrates a sectional diagram of a state where the sensor module of the second embodiment is attached into the manhole lid.
Figure 7B:
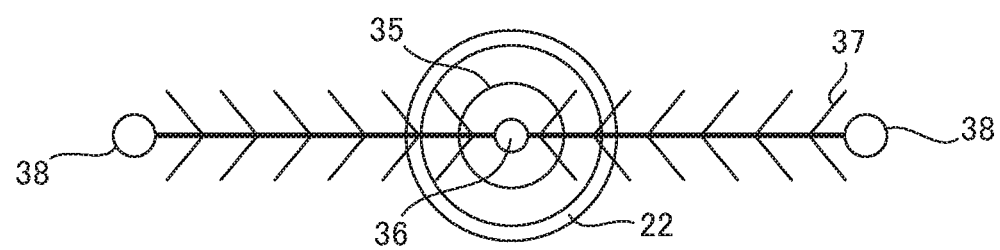
FIG. 7B illustrates a diagram viewed from below of a state where the sensor module of the second embodiment is attached into the manhole lid.

FIGS. 7A and 7B are each a diagram illustrating a state where the sensor module of the second embodiment is attached into the manhole lid, and FIG. 7A illustrates a sectional diagram and FIG. 7B illustrates a diagram viewed from below.

The sensor module 101 of the second embodiment differs from that of the first embodiment in that a cylindrical protection member 38 formed by a hard material is provided at the tip of the heat radiating fin of the heat radiation unit 37, and the others are the same.

When the sensor module 101 of the first embodiment is inserted into the screw hole of the manhole lid 102, the sensor module 101 is inserted in the state where the heat radiating fin is wound around the heat radiating unit axis 36. Since the heat radiating fin has elasticity, the expanding force is effective, and therefore the heat radiating fin is pushed against the thread of the screw hole. If the sensor module 101 is pushed into the screw hole in this state, the surface of the heat radiating fin may be damaged and in the worst case, part of the heat radiating fin may be broken, since the heat radiating fin is a thin sheet.

Thus, in the sensor module 101 of the second embodiment, the protection member 38 is provided at the tip of the heat radiating fin of the heat radiating unit 37. As illustrated in FIG. 6A, in the state where the heat radiating fin is inserted into the screw hole, the protection member 38 is pushed against the thread of the screw hole, and therefore the heat radiating fin is not damaged, since the heat radiating fin does not come into contact with the thread. The protection member 38 is formed by a hard material, and therefore the protection member 38 is not damaged when pushed into the screw hole in the state of being pushed against the thread, and even if damaged, there occurs no problem in particular.

FIGS. 8A and 8B are each a diagram illustrating a state where a sensor module of a third embodiment is attached into a manhole lid, and FIG. 8A illustrates a sectional diagram and FIG. 8B illustrates a diagram viewed from below.

The sensor module 101 of the third embodiment differs from the sensor module of the first embodiment in the shape and arrangement of the thermoelectric element 33 and the first and second heat transfer bodies, the shape of the heat radiating fin of the heat radiating unit 37, and the type of the water level sensor and the other portions are substantially the same as those of the structure of the first embodiment.

In the third embodiment, the second heat transfer body is a center axis 34P made of aluminum, and the heat radiating unit axis is a strut 36Q made of beryllium copper and having a diameter of 5 mm, and is attached to the center axis 34P via an attachment unit 36P. The heat radiating fin has a structure in which a laminated sheet 37P consisting of eight sheets including a beryllium copper sheet and a graphite sheet both having a thickness of 50 μm is attached to the strut 36Q and in the closed state with respect to the center axis 34P, the heat radiating fin is inserted into the screw hole of the manhole lid and after the insertion, the heat radiating fin opens by means of elasticity of the sheet.

A water level sensor 43P is a water pressure detection sensor and connected with the electronic circuit 41 by a cable 41. Thus, in the state of being installed, the water level sensor 43P is arranged at a position under the electronic circuit 41 in the vertical direction by an amount corresponding to the length of the cable 44. The water level sensor 43P may be arranged at a desired position within the manhole, by setting the length of the cable 44.

Although not illustrated schematically, in FIGS. 8A and 8B, the sensor module 101 of the third embodiment has a MEMS acceleration sensor besides the water level sensor, and detects vibration of the sensor module 101, i.e., vibration of the manhole lid 102 to which the sensor module 101 is attached integrally.

The wireless unit in the sensor module 101 of the third embodiment performs transmission to a relay station connected to an already-existing network by specified low power radio in the 300 MHz band. The distance in which sensor module 101 may communicate with the relay station is about 10 m.

In the system as illustrated in FIG. 4 which uses the sensor module 101 of the third embodiment, each sensor module 101 measures the water level every three hours and wirelessly transmits the data of the water level. Further, each sensor module 101 is configured to receive a command from the relay at the timing of transmission and also configured to be capable of transmitting more detailed data by reducing the measurement and transmission intervals to about 10 min in response to the command from the relay at the time of, for example, torrential rain. Further, on detecting an abnormal acceleration (vibration), for example, when the manhole lid is opened or damaged, the acceleration sensor quickly transmits the detected acceleration data wirelessly. A system to detect opening and closing of a manhole lid will be described later.

Figure 9A:
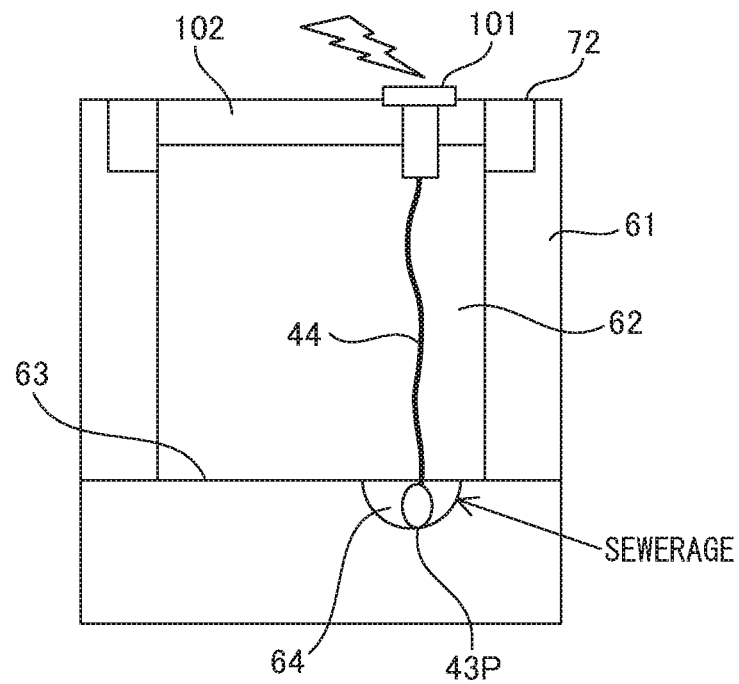
FIG. 9A is a diagram illustrating an arrangement example of the water level sensor within a manhole in the third embodiment.
Figure 9B:
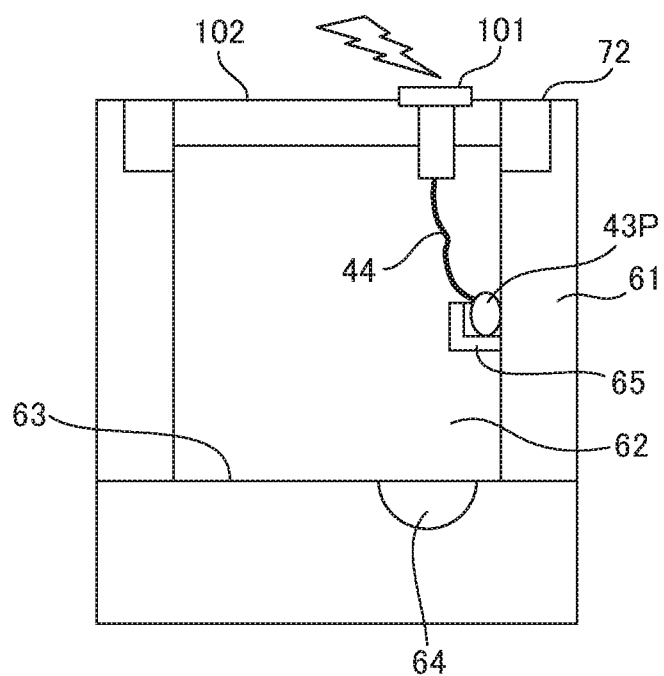
FIG. 9B is a diagram illustrating an arrangement example of the water level sensor within a manhole in the third embodiment.

FIGS. 9A and 9B are each a diagram illustrating an arrangement example of the water level sensor 43P within a manhole in the third embodiment. As illustrated in FIGS. 9A and 9B, the manhole is formed by a vertical wall 61, a base unit 63, a receiver unit 72 provided in the vertical wall 61, and a manhole lid 102 that is fit into the receiver unit 72. In the base unit 63, a sewage groove 64 is formed and at the normal time, sewage flows only into the sewage groove 64 and at the time of heavy rain, rainwater on the ground flows into the manhole and the water level rises. The manhole of such a system is referred to as a combined system and currently used in many municipalities. The structure of the manhole in which the sensor module is arranged is known in advance, and therefore information about the structure of the manhole, for example, about the height from the sewage groove 64 to the manhole lid 102 may be obtained.

FIG. 9A illustrates the case where the water level sensor 43P is arranged within the sewage groove 64 of the manhole into which sewage flows at the normal time. The length of the cable 44 is set so that the water level sensor 43P is located within the sewage groove 64. Thus, the flow of sewage at the normal time may be detected. For example, the sensor module 101 acquires the water level data within the sewage groove 64 periodically, such as once a day, and transmits the data to the server via the network. The server may observe the flow of sewage in the sewerage network by collecting the water level data from a large number of sensor modules 101.

FIG. 9B illustrates the case where the water level sensor 43P is arranged at the position corresponding to the dangerous water level of the manhole. As described above, in the combined system manhole, at the time of heavy rain, the rainwater on the ground flows into the manhole and the water level rises. In the municipality that manages the sewerage determines whether there is a risk of inundation based on the condition of rainfall and issues an advisory or a warning in accordance with the necessity and further, issues an evacuation order. In this case, in addition to the condition of rainfall, if a municipality may know whether the water level within the manhole has exceeded a predetermined water level, in addition to rainfall, municipality may determine the condition more accurately.

Thus, as illustrated in FIG. 9B, the dangerous water level of the manhole is set and a receiver 65 of the water level sensor 43P is fixed at the position of the dangerous water level. Then, after installing the sensor module 101 in the manhole lid 102, the manhole lid 102 is opened and then after placing the water level sensor 43P on the receiver 65, the manhole lid 102 is closed. In this case, a margin is given to the cable 44 so that even if the manhole lid 102 is opened, the water level sensor 43P may be placed on the receiver 65. The length of the cable 44 may be set so as to hold the water level sensor 43P at the height corresponding to the dangerous water level without providing the receiver 65, but in this case, the water level sensor 43P may be held in the air, and therefore the water level sensor 43P is unstable.

The water level sensor 43P turns the detection signal on when the water level sensor 43P itself is immersed in water. The sensor module 101 transmits immersion information on the water level sensor 43P to the server via the network, on detecting that the detection signal of the water level sensor 43P turns on. Thus, it may be observed in the monitoring room where the server is located as to whether the dangerous water level has been exceeded in each manhole, and it may be determined more appropriately as to whether inundation occurs.

In the present condition, for example, the water level and the flow rate of the sewerage are measured at ten and several pumping stations within the Tokyo Metropolitan area. At present, a large number of manhole lids 102 are installed, and a system capable of obtaining information by observing the flow of the sewerage in more detail may be easily constructed by mounting the water level sensor and the flow rate sensor in the sensor module 101 that is installed in the manhole lid 102. As described above, the water level and the flow rate are measured by the sensor module 101 once a day or once an hour and the data thereof is collected in the server in the data center through the 3G line or the PHS line. The data of the water level and the flow rate may be transmitted at the same time as the measurement, or to transmit the data after accumulating the data for one day or for one week in order to reduce power consumption.

As described previously, many municipalities employ the sewerage type (combined system sewerage) in which the rainwater flows into the sewerage and the prediction of the flow rate of the sewerage is strongly interlocked with the rainfall data. Therefore, by collecting detection data measured by the sensor module 101 and analyzing the detection data in combination with the data of the Japan Meteorological Agency, for example, the data may be used to provide flooding prediction, an advisory, and warning information on a river into which sewage flows. After a relationship model between the weather phenomena and the sewerage flow rate is established from the analysis results, a charge system may be constructed for provision and distribution of predicted data by predicting the flow rate of the sewerage at each place from the data of the Japanese Meteorological Agency. The flow rate of the sewerage varies every year depending of the house construction, the habitation circumstances, and the land development circumstances, and therefore the present information processing system capable of continuously updating data is useful.

At the time of localized torrential rain in a city, it is desirable to measure the water level every minute and to provide information, in order to secure safety of a sewerage operator and to prevent flooding of the sewerage. In this case, information is collected by limiting the sensor modules 101 to a small number of sensor modules 101 provided in the manhole lids 102 whose height above the sea level is relatively low. It is preferable to store an enough amount of electricity in advance in the electricity storage element 47 of the sensor module 101 that measures the water level. The signal processing unit 48 sequentially transmits data to the server 104 through the wireless unit 49, the 3G line, or the PHS line. The server 104 may provide the received information as a warning to the smartphone and the tablet of the operator and the inhabitants in the vicinity of flooding. In this case, the measurement vehicle parks on a specific manhole lid and data may be recovered by the server provided on the vehicle by near field radio communication.

The system that detects the water level of the sewerage by using the sensor module 101 of the third embodiment explained above may be implemented by using the sensor modules 101 of the first and second embodiments.

Figure 10:
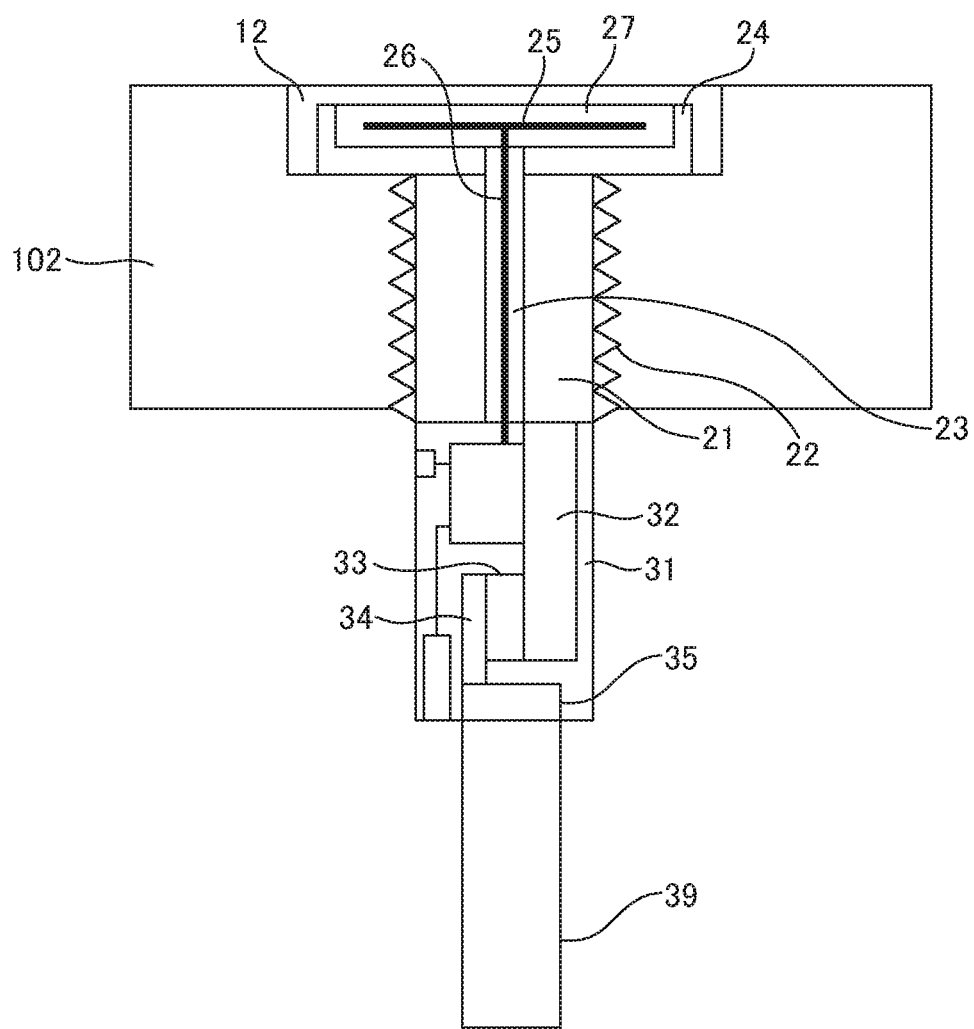
FIG. 10 is a diagram illustrating a modification example of a sensor module and is a sectional diagram of a state where a sensor module of a modification example is attached to a manhole lid.

FIG. 10 is a diagram illustrating a modification example of a sensor module and is a sectional diagram of a state where a sensor module of a modification example is attached to a manhole lid.

This modification example has a structure in which the heat radiating unit 37 does not have a heat radiating fin and a rod member 39 for heat radiation extends from the second heat transfer body 35 into the space within the manhole.

In the first to third embodiments, the heat radiating fin of the heat radiating unit 37 has elasticity, and therefore the heat radiating fin may be winded around the heat radiating unit axis and in the free state, the heat radiating fin enters the expanded state. Thus, the surface area of the heat radiating unit 37 increases and the function as a heat sink is improved. However, even if the heat radiating unit 37 is the rod member 39 as in FIG. 10, there occurs any problem in particular, if the difference in temperature between the first heat transfer body and the second heat transfer body is a difference in temperature sufficient for the thermoelectric element 33 to generate electricity, and therefore the structure is not a complicated structure having a heat radiating fin that expands and contracts.

There may be various applications by constructing a system by selecting the kind of sensor that is mounted on the sensor module of the embodiment. In the following, an example of such an application is explained.

Figure 11A:
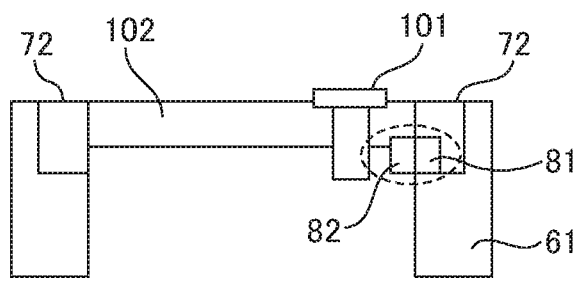
FIG. 11A illustrates a state is closed.
Figure 11B:
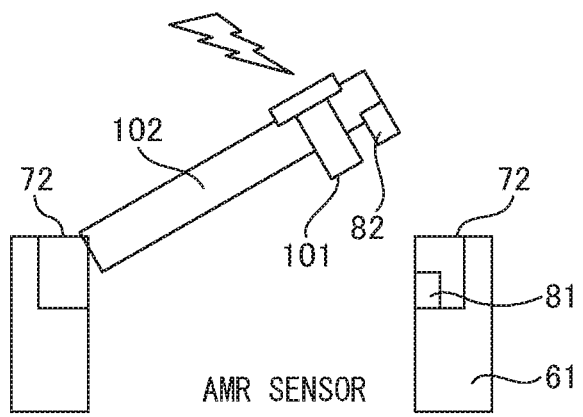
FIG. 11B illustrates a state where a manhole is opened.
Figure 11C:
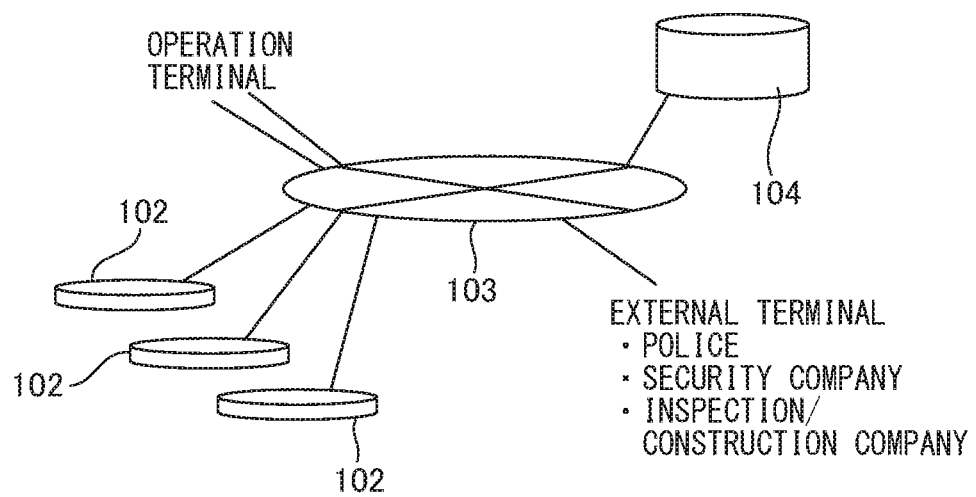
FIG. 11C illustrates a system configuration.

FIGS. 11A to 11C are each a diagram illustrating a system in which a sensor module detects opening and closing of a manhole lid by using a magnetic switch (AMR sensor), and FIG. 11A illustrates a state where the manhole is closed, FIG. 11B illustrates a state where the manhole is opened, and FIG. 11C illustrates a system configuration.

As illustrated in FIGS. 11A and 11B, a magnet 81 is fixed to a manhole frame 72, a magnetic switch (AMR sensor) 82 is fixed to a manhole lid 102, and the sensor module reads a detection signal of the magnetic switch 82. The detection signal of the magnetic switch 82 changes between the state where the manhole lid 102 is closed and the state where the manhole lid 102 is opened, by arranging the magnet 81 and the magnetic switch 82 so as to be in opposition to each other in proximity in the state where the manhole lid 102 is closed and so as to be apart from each other in the state where the manhole lid 102 is opened. Thus, opening and closing of the manhole lid 102 may be detected. The connection between the sensor module and the magnetic switch 82 is performed by, for example, arranging a signal line in the manhole lid 102. In this case, it is desirable to arrange the magnet 81, the magnetic switch 82, and the signal line in the state where the manhole lid 102 is opened.

Since opening and closing of the manhole lid may be detected, the detection data may be used (1) to prevent terrorism and crime, (2) as a certificate of execution of an inspection operation, etc.

As illustrated in FIG. 11C, to a network 103, in addition to a plurality of sensor modules and a server 104, and in addition to an operation terminal carried by an operator who performs an inspection operation, external terminals of the police, the security company, and the inspection/construction company are connected. An operator accesses the server by using the operation terminal and obtains information specifying a manhole to be inspected.

Figure 12:
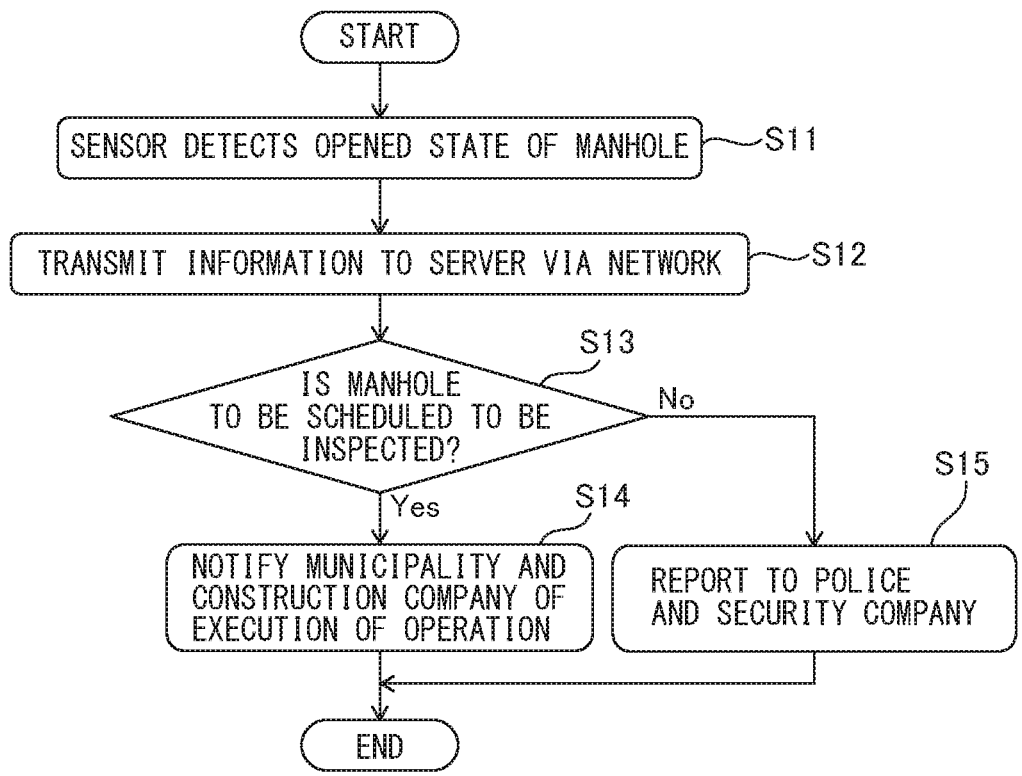
FIG. 12 is a flowchart illustrating an application method of the system that may detect opening and closing of the manhole lid.

FIG. 12 is a flowchart illustrating an application method of the system that may detect opening and closing of the manhole lid.

At step S11, the sensor module 101 detects that the manhole lid 102 has been opened by the detection signal of the magnetic switch 82.

At step S12, the sensor module 101 transmits information indicating that the manhole lid 102 has been opened to the server via the network along with the ID number specifying the manhole.

At step S13, the server determines whether the manhole lid corresponds to the manhole scheduled to be inspected, and if where the manhole lid corresponds to the manhole to be inspected, the processing proceeds to step S14, and if the manhole lid does not correspond to the manhole to be inspected, the processing proceeds to step S15.

At step S14, the related division of the municipality having ordered the inspection operation and the construction company are notified of the execution of the operation. Thus, it may estimate that the inspection operation has been performed. If the manhole lid is not opened within a predetermined period of time, it may estimate that the inspection operation has not been performed. If the manhole is opened, it is desirable to monitor whether the manhole lid is closed afterward. For example, if it is detected that the manhole lid is in the opened state for a period of time several times the time for the inspection, it may estimate that the operator forgot to close the manhole lid. The state such as this is dangerous for the traffic on the road, and therefore it is desirable to request the operation terminal to check the condition via the network.

At step S15, the manhole lid for which no inspection operation is scheduled has been opened is reported to the police or the security company.

In the examples of the application illustrated in FIGS. 11A to 11C and FIG. 12, the magnetic switch (AMR sensor) is used to detect opening and closing of the manhole lid, however opening and closing of the manhole lid may be detected by using another sensor.

Figure 13:
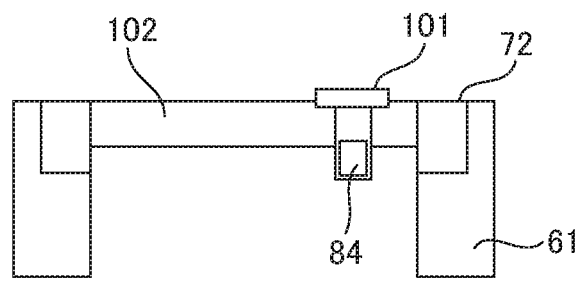
FIG. 13 is a diagram illustrating a configuration example in which an acceleration sensor 84 is mounted on the sensor module 101.

FIG. 13 is a diagram illustrating a configuration example in which an acceleration sensor 84 is mounted on the sensor module 101.

When a vehicle travels on the manhole lid 102, the manhole lid 102 vibrates and the acceleration sensor 84 detects the vibration of the manhole lid 102. However, this vibration is vibration whose amplitude is small and does not indicate movement of a distance longer than or equal to a predetermined distance. On the other hand, if the manhole is opened and closed, the detection signal of the acceleration sensor 84 indicates movement of a distance longer than or equal to a predetermined distance, and therefore by detecting this, opening and closing of the manhole may be detected.

The number of vehicles and the kinds of vehicle that pass on the manhole lid 102 may be detected, by using the sensor module 101 mounting an acceleration sensor (or vibration sensor). Thus, traffic jam information on, for example, a narrow road or an alley, for which the N system or the VICS (Vehicle Information and Communication System) does not perform measurement may be obtained.

Further, by storing a dataset in which the detection data of the sensor and the kinds of vehicle (small-size car, standard-size car, truck, etc.) are associated with each other in a memory in advance and from the detection data of the sensor and the above-described dataset, the information on the determined kinds of vehicle is transmitted to the server 104. By analyzing the difference in traffic in a city due to the vehicle type, city roads controls and a city evaluates may be performed, such as making a plan to guide specific vehicles to specific roads.

As the sensor in this case, an acoustic sensor, such as a microphone arranged on the top of the sensor module, and a magnetic sensor may be used.

When the sensor module has a sensor that detects temperature, humidity, and vibration (acceleration), the degree of deterioration of the concrete portion and the manhole lid of each manhole maybe estimated from the detection data. When temperature and humidity are high, the change in temperature and humidity is large, and vibration is strong (maximum value, frequency), the concrete portion and the manhole lid of the manhole are apt to deteriorate. When a repair plan of the concrete portion of the manhole and an exchange plan of the manhole lid are created, the plan may have higher accuracy.

Further, it is known that hydrogen sulfide that is generated in the sewerage rapidly deteriorates the manhole. The generation of hydrogen sulfide is a factor of the complaint of the neighboring residents. By mounting a hydrogen sulfide sensor on the sensor module, a municipality may quickly deal with the complaint of the residents, as well as improving the deterioration prediction accuracy of the manhole.

The server in the embodiments and the application examples explained above is used as a dedicated device. However, this is not limited and a general-purpose computer may be used as the server and to cause the computer to perform the same operations as those of the server 104 by installing programs that implement those operations. In this case, the programs may be supplied via a storage medium, such as a CD and a DVD, or the programs may be downloaded from a network.

As above, the embodiments are explained, but all the examples and conditions described here are described for the purpose of aiding the understanding of the invention and the concept of the invention that is applied to the technique. In particular, the described examples and conditions are not intended to limit the scope of the invention and do not indicate the merits and demerits of the invention. Although the embodiments of the invention are described in detail, it should be understood that various modifications, substitutions, and alterations can be made without deviating from the sprit and scope of the invention.

What is claimed is:

1. A sensor module, comprising:
a bolt configured to screw into a through-hole passing through a manhole lid; and
an electronic circuit comprising: a storage configured to store at least part of a measurement sensor, a power source and a wireless antenna communicator, the storage being located on a top of the bolt, and an outer diameter of the storage being smaller than an outer diameter of the bolt, wherein
the power source includes a thermoelectric power generator configured to generate electric power by a difference in temperature between a first heat transfer body thermally connected to the manhole lid and a second heat transfer body thermally connected to a heat radiating body within a manhole,
the measurement and the communicator are driven by the electric power generated by the thermoelectric power generator and measurement data of the measurement sensor is transmitted to an outside via the communicator, and
the second heat transfer includes a fin that is changed into a shape that passes through the through-hole and which enters an expanded state after passing through the through-hole.

2. The sensor module according to claim 1, the through-hole is a screw hole of the manhole lid.

3. The sensor module according to claim 2, wherein at least part including the second heat transfer of the storage has a shape that can be inserted into the manhole from outside the manhole through the screw hole.

4. The sensor module according to claim 1, wherein the measurement sensor detects at least one of temperature, humidity, gas concentration, a water level, a sewage flow rate, and vibration.

5. The sensor module according to claim 1, wherein the measurement sensor includes at least one of a temperature sensor, a humidity sensor, a gas concentration sensor, a water level sensor, a sewage flow rate sensor, and a vibration sensor having a shape that can be inserted into the manhole from outside the manhole through the through-hole.

6. The sensor module according to claim 1, wherein the measurement sensor receives a detection signal from at least one of a temperature sensor, a humidity sensor, a gas concentration sensor, a water level sensor, a sewage flow rate sensor, and a vibration sensor arranged within the manhole.

7. The sensor module according to claim 1, wherein the electronic circuit configured to process a detection signal of the measurement sensor and to perform processing to transmit data of the detection signal from the communicator.

8. The sensor module according to claim 7, wherein
the communicator has an antenna located on a top of the through-hole and a signal line provided between the antenna and the electronic circuit.

9. The sensor module according to claim 7, wherein
the communicator has an external terminal located on a top of the through-hole and a signal line provided between the external terminal and the electronic circuit.

10. A fixing method of a sensor module, wherein the sensor module comprising: a bolt configured to screw into a through-hole passing through a manhole lid, and an electronic circuit comprising: a storage configured to store at least part of a measurement sensor, a power source and a wireless antenna communicator, the storage being located on a top of the bolt, and an outer diameter of the storage being smaller than an outer diameter of the bolt, wherein the method comprises:
forming a screw hole by processing a manhole lid from a surface to form a thread in the through-hole of the manhole lid; and
fixing a screw portion of the sensor module having a thermoelectric power generator configured to generate electric power by a difference in temperature between a first heat transfer body thermally connected to the manhole lid and a second heat transfer body thermally connected to a heat radiating body within a manhole, and having the communicator and the measurement sensor are driven by the electric power generated by the thermoelectric power generator and measurement data of the measurement sensor is transmitted to an outside via the communicator, into the screw hole by screwing the screw portion of the sensor module, the second heat transfer including a fin that is changed into a shape that passes through the through-hole and which enters an expanded state after passing through the through-hole.

11. A manhole information collection and processing system, comprising:
a plurality of sensor modules installed in a plurality of manhole lids, each of the plurality of sensor modules including a bolt configured to screw into a through-hole passing through a manhole lid, and an electronic circuit comprising: a storage configured to store at least part of a measurement sensor, a power source and a wireless antenna communicator, the storage being located on a top of the bolt, and an outer diameter of the storage being smaller than an outer diameter of the bolt;
a server that collects and processes data of the plurality of sensor modules; and
a wireless communication network that connects wireless antenna communicators of the plurality of sensor modules to the server so as for communication, wherein
the power source of said each of the plurality of sensor modules includes a thermoelectric power generator configured to generate electric power by a difference in temperature between a first heat transfer body thermally connected to the manhole lid and a second heat transfer body thermally connected to a heat radiating body within a manhole,
the measurement sensor and the communicator are driven by the electric power generated by the thermoelectric power generator and measurement data of the measurement sensor is transmitted to an outside via the communicator, and
the second heat transfer includes a fin that is changed into a shape that passes through the through-hole and which enters an expanded state after passing through the through-hole.

12. The manhole information collection and processing system according to claim 11, wherein
the through-hole is a screw hole of the manhole lid.

13. A manhole information collection and processing method of collecting measurement data of each of a plurality of sensor modules installed in a plurality of manhole lids, said each of the plurality of sensor modules including a bolt configured to screw into a through-hole passing through a manhole lid, and an electronic circuit comprising: a storage configured to store at least part of a measurement sensor, a power source and a wireless antenna communicator, the storage being located on a top of the bolt, and an outer diameter of the storage being smaller than an outer diameter of the bolt, wherein the method comprises:
connecting a mobile terminal having a communication function to the communicator of said each of the plurality of sensor modules;
reading the measurement data of said each of the plurality of sensor modules by the mobile terminal and storing the reading measurement data; and
transmitting the reading measurement data of said each of the plurality of sensor modules stored in the mobile terminal to a server, wherein the power source of said each of the plurality of sensor modules includes a thermoelectric power generator configured to generate electric power by a difference in temperature between a first heat transfer body thermally connected to the manhole lid and a second heat transfer body thermally connected to a heat radiating body within a manhole,
the measurement sensor and the communicator are driven by the electric power generated by the thermoelectric power generator and the measurement data of said each of the plurality of sensor modules is transmitted to an outside via the communicator, and the second heat transfer includes a fin that is changed into a shape that passes through the through-hole and which enters an expanded state after passing through the through-hole.

14. The manhole information collection and processing method according to claim 13, wherein
the communicator of said each of the plurality of sensor modules is a wireless communicator, and
the mobile terminal collects the measurement data by wireless communication from the communicator of said each of the plurality of sensor modules.

15. The manhole information collection and processing method according to claim 13, wherein
the communicator of said each of the plurality of sensor modules has an external communication terminal, and
the measurement data is collected by connecting a communication terminal of the mobile terminal to the external communication terminal of the communicator of said each of the plurality of sensor modules.

* * * * *